United States Patent
Kant et al.

(10) Patent No.: US 10,451,977 B2
(45) Date of Patent: Oct. 22, 2019

(54) LITHOGRAPHIC METHOD AND APPARATUS

(71) Applicant: ASML NETHERLANDS B.V., Veldhoven (NL)

(72) Inventors: Nick Kant, Utrecht (NL); Nico Vanroose, Borgerhout (BE); Johannes Jacobus Matheus Baselmans, Oirschot (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 15/527,254

(22) PCT Filed: Nov. 30, 2015

(86) PCT No.: PCT/EP2015/078096
§ 371 (c)(1),
(2) Date: May 16, 2017

(87) PCT Pub. No.: WO2016/087388
PCT Pub. Date: Jun. 9, 2016

(65) Prior Publication Data
US 2017/0357159 A1    Dec. 14, 2017

(30) Foreign Application Priority Data

Dec. 2, 2014 (EP) .................................. 14195783
Sep. 24, 2015 (EP) .................................. 15186673
Nov. 30, 2015 (EP) .................................. 15196964

(51) Int. Cl.
*G03F 7/20* (2006.01)
*G01M 11/02* (2006.01)

(52) U.S. Cl.
CPC ......... *G03F 7/706* (2013.01); *G01M 11/0242* (2013.01); *G03F 7/20* (2013.01);
(Continued)

(58) Field of Classification Search
CPC .... G03F 7/20; G03F 7/70258; G03F 7/70308; G03F 7/705; G03F 7/706
(Continued)

(56) References Cited

U.S. PATENT DOCUMENTS 6,784,977 B2   8/2004   Bunau et al.
7,262,831 B2   8/2007   Akhssay et al.
(Continued)

FOREIGN PATENT DOCUMENTS

CN   102768474   11/2012
JP   S63115203   5/1988
(Continued)

OTHER PUBLICATIONS

Japanese Office Action issued in corresponding Japanese Application No. 2017-526086, dated May 28, 2018, with English translation, 18 pages.
(Continued)

*Primary Examiner* — Colin W Kreutzer
(74) *Attorney, Agent, or Firm* — Pillsbury Winthrop Shaw Pittman LLP

(57) ABSTRACT

A method of reducing an aberration of a lithographic apparatus, the method including measuring the aberration, taking the measured aberration into account, estimating a state of the lithographic apparatus, calculating a correction using the estimated state, and applying the correction to the lithographic apparatus.

20 Claims, 5 Drawing Sheets

(52) U.S. Cl.
CPC .......... *G03F 7/705* (2013.01); *G03F 7/70258* (2013.01); *G03F 7/70308* (2013.01)

(58) Field of Classification Search
USPC ........................................ 355/52, 67, 68, 77
See application file for complete search history.

(56) References Cited

U.S. PATENT DOCUMENTS

| | | | |
|---|---|---|---|
| 7,289,858 | B2 | 10/2007 | Van Donkelaar et al. |
| 7,403,264 | B2 | 7/2008 | Jeunink et al. |
| 7,421,358 | B2 | 9/2008 | Tuohy |
| 7,580,113 | B2 | 8/2009 | Tel et al. |
| 8,175,831 | B2 | 5/2012 | Izikson et al. |
| 8,184,265 | B2 | 5/2012 | Wardenier |
| 8,203,696 | B2 | 6/2012 | Bittner et al. |
| 8,482,718 | B2 | 7/2013 | Corbeij et al. |
| 8,741,510 | B2 | 6/2014 | Takahashi et al. |
| 9,417,533 | B2 | 8/2016 | Prosyentsov et al. |
| 9,513,564 | B2 | 12/2016 | Ozawa |
| 10,078,272 | B2 | 9/2018 | Downes et al. |
| 2002/0111038 | A1* | 8/2002 | Matsumoto ......... G03F 7/70458 438/763 |
| 2002/0191165 | A1 | 12/2002 | Baselmans et al. |
| 2003/0002023 | A1 | 1/2003 | Bunau et al. |
| 2005/0167514 | A1 | 8/2005 | Kaushal et al. |
| 2005/0267609 | A1 | 12/2005 | Van Donkelaar et al. |
| 2006/0008716 | A1 | 1/2006 | Jeunink et al. |
| 2006/0114437 | A1 | 6/2006 | Akhssay et al. |
| 2006/0256836 | A1 | 11/2006 | Hutter et al. |
| 2007/0177135 | A1 | 8/2007 | Tuohy |
| 2007/0291243 | A1 | 12/2007 | Suzuki |
| 2007/0296938 | A1 | 12/2007 | Tel et al. |
| 2008/0286885 | A1 | 11/2008 | Izikson et al. |
| 2009/0225293 | A1* | 9/2009 | Shigenobu ............. G03B 27/32 355/53 |
| 2009/0231568 | A1 | 9/2009 | Fukuhara |
| 2009/0323039 | A1 | 12/2009 | Wardenier |
| 2011/0043780 | A1 | 2/2011 | Corbeij et al. |
| 2011/0181855 | A1 | 7/2011 | Bittner et al. |
| 2012/0120379 | A1 | 5/2012 | Phillips et al. |
| 2012/0133914 | A1 | 5/2012 | Prosyentsov et al. |
| 2013/0060354 | A1 | 3/2013 | Choi et al. |
| 2013/0137050 | A1 | 5/2013 | Takahashi et al. |
| 2014/0204353 | A1 | 7/2014 | Ozawa |
| 2015/0049315 | A1 | 2/2015 | Hoshino |

FOREIGN PATENT DOCUMENTS

| | | |
|---|---|---|
| JP | 2002073111 | 3/2002 |
| JP | 2002334835 | 11/2002 |
| JP | 2003-124110 | 4/2003 |
| JP | 2005526388 | 9/2005 |
| JP | 2006-024941 | 1/2006 |
| JP | 2006-157020 | 6/2006 |
| JP | 2006332168 | 12/2006 |
| JP | 2007157824 | 6/2007 |
| JP | 2007-250723 | 9/2007 |
| JP | 2009513944 | 4/2009 |
| JP | 2009205641 | 9/2009 |
| JP | 2009282926 | 12/2009 |
| JP | 2012503870 | 2/2012 |
| JP | 2012119680 | 6/2012 |
| JP | 2013-115348 | 6/2013 |
| WO | 2007123189 | 1/2007 |

OTHER PUBLICATIONS

El-Awady, Khalid et al., "Programmable thermal processing module for semiconductor substrates", IEEE Transactions on Control Systems Technology, vol. 12, No. 4, pp. 493-509 (2004).

Bikcora, Can et al., "Thermal Deformation Prediction in Reticles for Extreme Ultraviolet Lithography Based on a Measurement-Dependent Low-Order Model", IEEE Transactions on Semiconductor Manufacturing, vol. 27, No. 1, pp. 104-117 (Feb. 2014).

Verhagen, Michel et al., "Chapter 10: The System-Identification Cycle", Filtering and System Identification: A Least Squares Approach, pp. 345-394 (2007).

Verhagen, Michel et al., "Subspace model identification Part 1. The output-error state-space model identification class of algorithms", International Journal of Control, vol. 56, No. 5, pp. 1187-1210, 1992.

Van Overschee, Peter et al., "Chapter 4: Combined Deterministic-Stochastic Identification", Subspace Identification for Linear Systems, pp. 95-134 (1996).

Verhagen, Michel et al., "Chapter 5: Kalman Filtering", Filtering and System Identification: A Least Squares Approach, pp. 126-177 (2007).

Verhagen, Michel et al., "Chapter 8: Prediction-error Parametric Model Estimation", Filtering and System Identification: A Least Squares Approach, pp. 254-291 (2007).

Verhagen, Michel et al., "Chapter 9: Subspace Model Identification", Filtering and System Identification: A Least Squares Approach, pp. 292-344 (2007).

International Search Report and Written Opinion dated Mar. 24, 2016 in corresponding International Patent Application No. PCT/EP2015/078096.

U.S. Office Action issued in corresponding U.S. Appl. No. 15/760,629, dated Nov. 15, 2018.

Japanese Office Action issued in corresponding Japanese Patent Application No. 2017-526086, dated Jan. 15, 2019.

Notice of Allowance issued in corresponding U.S. Appl. No. 15/760,629, dated May 30, 2019.

U.S. Office Action issued in corresponding U.S. Appl. No. 16/458,601, dated Aug. 12, 2019.

* cited by examiner

LITHOGRAPHIC METHOD AND APPARATUS

CROSS-REFERENCE TO RELATED APPLICATIONS

This application is the U.S. national phase entry of PCT patent application no. PCT/EP2015/078096, which was filed on Nov. 30, 2015, which claims the benefit of priority of European patent application no. 14195783.7, which was filed on Dec. 2, 2014, and European patent application no. 15186673.8, which was filed on Sep. 24, 2015, and European patent application no. 15196964.9, which was filed on Nov. 30, 2015, and which applications are incorporated herein in their entireties by reference.

FIELD

The present invention relates to a lithographic method and apparatus, and particularly but not exclusively to a method of correcting aberrations caused by a projection system of a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically by using a projection system to image the pattern onto a layer of radiation-sensitive material (resist) provided on the substrate. In general, a single substrate will contain a network of adjacent target portions that are successively patterned.

The projection system which is used to image the pattern onto the substrate will induce some aberrations in the projected image.

It is an object of the invention to provide a method of reducing aberrations which obviates or mitigates a problem associated with the prior art.

SUMMARY

According to a first aspect of the invention there is provided a method of reducing an aberration of a lithographic apparatus, the method comprising measuring the aberration, taking the measured aberration into account, estimating a state of the lithographic apparatus, calculating a correction using the estimated state, and applying the correction to the lithographic apparatus.

The estimated state of the lithographic apparatus may be used to generate an estimated aberration of the lithographic apparatus.

Estimating the state of the lithographic apparatus may take into account a history of operation of the lithographic apparatus. This is advantageous because estimating the state of the lithographic apparatus taking into account both the measured aberration and the history of operation of the lithographic apparatus may improve the accuracy of the estimated state of the lithographic apparatus.

A model generated using the history of operation of the lithographic apparatus may be used when estimating the state of the lithographic apparatus.

Estimating the state of the lithographic apparatus may include using a filter which applies a weighting to the measured aberration.

The filter may be determined using the model along with an estimated joint covariance matrix.

The filter may be a Kalman filter.

Estimating the state of the lithographic apparatus may use a plurality of measured aberrations. Different weightings may be applied for different aberrations.

For some aberrations the weighting may be such that only the measured aberration value is used.

For some aberrations the weighting may be such that the measured aberration value is not used. For example, for some aberrations the measured aberration may have no influence upon the estimated state of the lithographic apparatus.

The state of the lithographic apparatus may be estimated, and a correction applied to the lithographic apparatus, before exposure of each target portion of a substrate.

Estimating the state of the lithographic apparatus before each exposure does might not include measuring the aberration before each exposure.

The model may be a state-space linear time-invariant model.

The model may be generated using sub-space identification.

Inputs used to generate the model may include inputs relating to the environment of the projection system and inputs relating to exposure settings used by the lithographic apparatus.

An exposure setting may comprise information relating to a mask being used by the lithographic apparatus and/or information relating to an illumination mode used by the lithographic apparatus.

The model may be periodically recalibrated.

During recalibration of the model unprocessed measured aberrations may be used to calculate the correction to be applied to the projection system if a new exposure setting is being used by the lithographic apparatus.

The model may be recalibrated each time a lot of substrates has been exposed by the lithographic apparatus.

The recalibration may comprise recalculating the model.

The recalibration may comprise adding to the existing model a new model generated using newly received data.

The filter may be periodically recalibrated.

The estimated aberration values may be determined periodically using the model.

The estimated aberration values may be determined before exposure of each target portion of a substrate by the lithographic apparatus.

The aberration or aberrations may be measured periodically.

Prior to measuring aberrations the following steps may be performed: the model is used to estimate aberrations caused by the projection system, a correction is calculated and the correction is applied to the lithographic apparatus.

The aberrations may be measured prior to exposure of each substrate by the lithographic apparatus.

The aberration or aberrations may be expressed as the variation of Zernike coefficients across the field.

The aberrations may be expressed as Zernike coefficients of field orders.

Applying the calculated correction to the lithographic apparatus may comprise manipulating lenses of the projection system.

The model may be generated using measurements obtained when the numerical aperture of the lithographic apparatus is at maximum, and the model may then be modified to estimate aberrations caused by the projection system when the numerical aperture of the lithographic apparatus is reduced to a numerical aperture used during exposure of substrates.

The model may be imported into the lithographic apparatus following generation of the model using a different lithographic apparatus.

The method may further comprise monitoring for faults in the lithographic apparatus by monitoring differences between estimated expected aberrations and measured aberrations.

A fault may be identified if the difference between an estimated expected aberration and a measured aberration is greater than an expected difference.

According to a second aspect of the invention there is provided a computer program comprising computer readable instructions configured to cause a processor to carry out a method according to the first aspect of the invention.

According to a third aspect of the invention there is provided a computer readable medium carrying a computer program according to the second aspect of the invention.

According to a fourth aspect of the invention there is provided a computer apparatus for reducing aberrations caused by a projection system of a lithographic apparatus comprising a memory storing processor readable instructions, and a processor arranged to read and execute instructions stored in said memory, wherein said processor readable instructions comprise instructions arranged to control the computer to carry out a method according to the first aspect of the invention.

According to a fifth aspect of the invention there is provided a lithographic apparatus comprising a projection system configured to projection a pattern from a mask onto a substrate, the lithographic apparatus further comprising a sensor configured to measure aberrations caused by the projection system, a processor configured to calculate a correction to be applied to the projection system, and lens manipulators configured to apply the correction by manipulating lenses of the projection system; wherein the processor is configured to estimate aberrations caused by the projection system, using the measured aberrations and a model which takes into account a history of operation of the lithographic apparatus, and calculate the correction to be applied to the projection system using the estimated aberrations.

The processor may be further configured to operate according to any of the above described optional parts of the first aspect of the invention.

According to a sixth aspect of the invention there is provided a lithographic apparatus configured to perform the method of the first aspect of the invention.

According to a seventh aspect of the invention there is provided a method of reducing aberrations caused by a projection system of a lithographic apparatus, the method comprising performing a measurement of aberrations caused by the projection system using a sensor located in the lithographic apparatus, using a model to estimate aberrations caused by the projection system, the model taking into account a history of operation of the lithographic apparatus, processing the measured aberrations by combining the estimated aberrations and the measured aberrations, thereby generating a new set of aberrations, calculating a correction to be applied to the projection system using the new set of aberrations, and applying the calculated correction to the lithographic apparatus.

According to an eighth aspect of the invention there is provided a lithographic apparatus comprising a projection system configured to projection a pattern from a mask onto a substrate, the lithographic apparatus further comprising a sensor configured to measure aberrations caused by the projection system, a processor configured to calculate a correction to be applied to the projection system, and lens manipulators configured to apply the correction by manipulating lenses of the projection system; wherein the processor is configured to use a model to estimate aberrations caused by the projection system, the model taking into account a history of operation of the lithographic apparatus, process the measured aberrations by combining the estimated aberrations and the measured aberrations, thereby generating a new set of aberrations, and calculating the correction to be applied to the projection system using the new set of aberrations.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
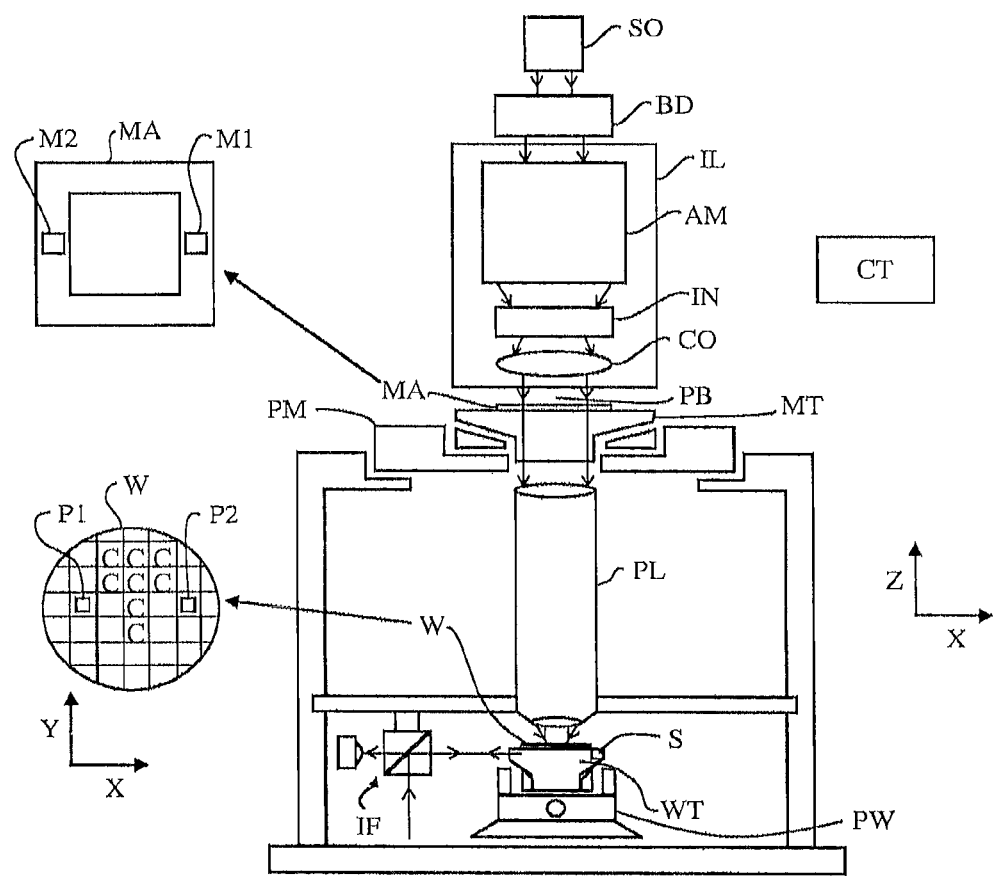
FIG. 1 depicts a lithographic apparatus according to an embodiment of the invention.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" used herein should be broadly interpreted as referring to a device that can be used to impart a radiation beam with a pattern in its cross-section such as to create a pattern in a target portion of the substrate. It should be noted that the pattern imparted to the radiation beam may not exactly correspond to the desired pattern in the target portion of the substrate. Generally, the pattern imparted to the radiation beam will correspond to a particular functional layer in a device being created in the target portion, such as an integrated circuit.

A patterning device may be transmissive or reflective. Examples of patterning device include masks and programmable mirror arrays. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

A support structure holds the patterning device. It holds the patterning device in a way depending on the orientation of the patterning device, the design of the lithographic apparatus, and other conditions, such as for example whether or not the patterning device is held in a vacuum environment. The support can use mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system". The term "lens" may be used herein as shorthand for "projection lens".

The illumination system may also encompass various types of optical components, including refractive, reflective, and catadioptric optical components for directing, shaping, or controlling the beam of radiation, and such components may also be referred to below, collectively or singularly, as a "lens".

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion techniques are well known in the art for increasing the numerical aperture of projection systems.

FIG. 1 schematically depicts a lithographic apparatus according to a particular embodiment of the invention. The apparatus comprises:
   an illumination system IL to condition a beam PB of radiation (e.g. UV radiation).
   a support structure (e.g. a mask table) MT to support a patterning device (e.g. a mask) MA and connected to first positioning device PM to accurately position the patterning device with respect to item PL;
   a substrate table (e.g. a substrate table) WT for holding a substrate (e.g. a resist coated wafer) W and connected to second positioning device PW for accurately positioning the substrate with respect to item PL; and
   a projection system (e.g. a refractive projection lens) PL configured to image a pattern imparted to the radiation beam PB by patterning device MA onto a target portion C (e.g. comprising one or more dies) of the substrate W.

As here depicted, the apparatus is of a transmissive type (e.g. employing a transmissive mask). Alternatively, the apparatus may be of a reflective type (e.g. employing a reflective mask or programmable mirror array of a type as referred to above).

The illumination system IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illumination system IL with the aid of a beam delivery system BD comprising for example suitable directing mirrors and/or a beam expander. In other cases the source may be integral part of the apparatus, for example when the source is a mercury lamp. The source SO and the illumination system IL, together with the beam delivery system BD if required, may be referred to as a radiation system.

The illumination system IL may comprise adjusting means AM for adjusting the angular intensity distribution of the beam. The outer and/or inner radial extent (commonly referred to as σ-outer and σ-inner, respectively) of the intensity distribution in a pupil plane of the illumination system can be adjusted. The adjusting means may also be capable of selecting different forms of illumination mode, such as for example a dipole mode or a quadrupole mode. Different forms of illumination mode may be used to project different mask patterns. A combination of an illumination mode and a mask MA may be referred to as an exposure setting. The exposure setting may include other variables such as for example a particular polarisation of the radiation beam PB.

In addition, the illumination system IL generally comprises various other components, such as an integrator IN and a condenser CO. The illumination system provides a conditioned beam of radiation PB, having a desired uniformity and intensity distribution in its cross section. The angular intensity distribution of the radiation beam PB will depend upon the illumination mode that has been selected by the adjusting means AM.

The radiation beam PB is incident on the patterning device (e.g. mask) MA, which is held on the support structure MT. Having traversed the patterning device MA, the beam PB passes through the projection system PL, which focuses the beam onto a target portion C of the substrate W. With the aid of the second positioning device PW and position sensor IF (e.g. an interferometric device), the substrate table WT can be moved accurately, e.g. so as to position different target portions C in the path of the beam PB. Similarly, the first positioning device PM and another position sensor (which is not explicitly depicted in FIG. 1) can be used to accurately position the patterning device MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning device PM and PW. Patterning device MA and substrate W may be aligned using patterning device alignment marks M1, M2 and substrate alignment marks P1, P2. In an alternative arrangement (not illustrated) movement of the object tables MT, WT may be controlled by a planar motor and encoder system.

The depicted apparatus may for example be used in a scan mode, in which the support structure MT and the substrate table WT are scanned synchronously while a pattern imparted to the beam PB is projected onto a target portion C (i.e. a single dynamic exposure). The velocity and direction of the substrate table WT relative to the support structure MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion. The scanning direction is conventionally referred to as the y-direction of the lithographic apparatus.

A sensor S is provided on the substrate table WT of the lithographic apparatus. The sensor S is configured to measure aberrations in the radiation beam projected by the projection lens PL (which may also be referred to as the projection system). The sensor S may for example comprise an imaging array (e.g. a CCD array) located a few millimeters below a diffraction grating (e.g. comprising several hundred lines). An object marker (not shown) which may for example consist of a few lines printed within a pinhole is provided either on the mask MA or on the mask table MT. In order to perform a measurement of the aberrations caused by the projection lens PL, the mask table MT is moved such that the radiation beam PB illuminates the object marker. The projection lens PL forms an image of the object marker at the substrate table WT. The sensor S is positioned beneath the projection lens PL to capture the far field image of the object marker. A series of object marker images are captured at different positions relative to the XY plane (i.e. different xy-direction positions using the Cartesian coordinates shown in FIG. 1). The images are analysed by a processor PR to provide measurements of the aberrations which have been introduced into the radiation beam PB by the projection lens PL. The aberrations may for example be expressed as a set of Zernikes. In an embodiment, Zernike coefficients Z2 to Z25 of the field orders offset, tilt, curvature and third order may be used to express the aberrations. Thus, a description of the state of the projection lens may have 96 coefficients (24×4). In alternative embodiments other ranges of Zernike coefficients may be used. For example Zernike coefficients up to $Z_{64}$ may be used, or Zernike coefficients up to $Z_{100}$ may be used.

A set of measurements may be performed with the object marker and sensor S at different x-direction positions along an area which is illuminated by the radiation beam PB (the illuminated area may be referred to an exposure slit). Alternatively, the sensor S may comprise an imaging array (e.g. CCD array) which is sufficiently large to capture an image along the entire x-direction extent of the exposure slit. Where this is the case a set of object markers may be provided at mask level, the object markers being spaced apart along the x-direction of the exposure slit. Aberration measurements are then determined for each object marker of the set. In an embodiment the set of object markers may comprise seven object markers, and thus aberration measurements may be provided at seven positions spaced apart along the x-direction of the exposure slit. In some instances images may be captured away from a central line which bisects the exposure slit (which may correspond with y=0) and are used to provide aberration measurements.

A controller CT is configured to adjust lenses of the projection lens PL in order to correct the aberrations caused by the projection lens PL. Several of the lenses of the projection lens PL may be provided with manipulators which are configured to modify the shape, position and/or orientation of those lenses. The lens manipulators may for example be mechanical actuators which apply compressive or stretching force to edges of a lens, or may for example be heaters which are configured to selectively heat parts of a lens. The effect of modifying the lens shapes, positions and orientations using the manipulators is well-known and thus the lens manipulators can be used to correct the aberration introduced by the projection lens PL in a known way (the lens adjustments and the aberrations may be considered to have a linear relationship). The sensor S, processor PR, controller CT and lens manipulators thus comprise a feedback loop which is used to measure aberrations and to correct measured aberrations. In one example, the sensor S and controller CT determine that a $Z_9$ offset is present. This may be reduced by introducing a linear combination of manipulator adjustments which introduce the opposite $Z_9$ offset. The linear combination of manipulator adjustments is determined by optimizing a merit function (typically a sum of squares of the measured aberrations) by treating the various lens manipulators as the degrees of freedom. If a is a vector containing all manipulator positions and z is a vector containing all the aberrations measured at the different positions in the exposure slit, then the aberrations resulting after a lens adjustment will be z'=z−L·a where L is a matrix containing the 'lens dependencies' (the lens dependencies being a description of the aberrations introduced by each manipulator). A simple example of a solution is the least-squares solution, where z' is minimized treating the vector a as the variable parameter set, giving a_min= (L·L^T)^(−1)·L^T·z. Solutions other than a least-squares solution may be used.

The feedback loop may thus be used to correct aberrations introduced by the projection lens PL. It may not be possible to entirely remove all aberrations introduced by the projection lens PL. However, reduction of the aberrations such that they fall below thresholds may be sufficient to allow projection of a pattern onto substrates with a desired accuracy using the projection lens PL. References to correction of aberrations is not intended to mean that aberrations are entirely eliminated (this would be impractical). Instead, aberration correction may be interpreted as meaning a projection lens adjustment which reduces (or is intended to reduce) aberrations caused by the projection lens.

The aberration measurement performed using the sensor will include some error.

Sources of the error may include limited resolution of the imaging array of the sensor and noise present in the measured image. In some instances, the error in the aberration measurement may be so large that adjusting the lenses of the projection lens PL to correct for apparent aberrations will in fact reduce the accuracy with which patterns are projected onto the substrate. In other words, the aberrations which are caused by the projection lens PL are increased, or at least aberrations which have a significant impact upon the projected pattern are increased such that the accuracy of the projected pattern is reduced.

Figure 2:
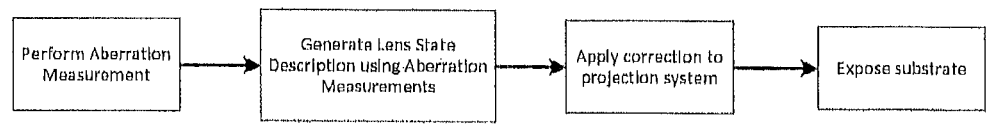
FIGS. 2 and 3 depict a method of aberration correction which is known from the prior art.
Figure 3:
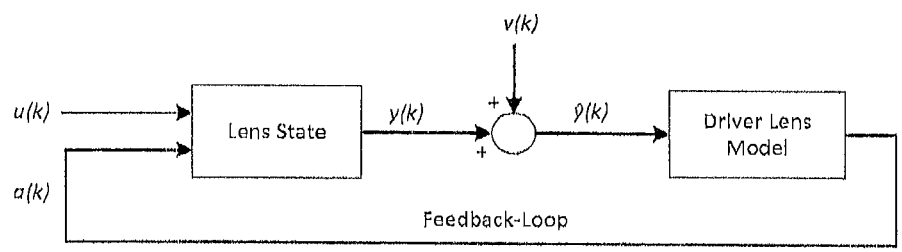

Aberration correction according to the prior art is depicted schematically in FIGS. 2 and 3. Referring first to FIG. 2, an aberration measurement is performed (e.g. using the sensor S as described above). A processor receives the aberration measurement and provides an output which represents the aberration of the projection lens as Zernike coefficients of different field orders. This representation of the projection lens aberration as Zernike coefficients is an example of a lens state description. Using different Zernike coefficients of different field orders to represent projection lens aberration is just one example of a projection lens aberration representation (i.e. a lens state description). Other representations are possible (i.e. the lens state description may have some other form). For example, the projection lens aberration may be represented as Zernike coefficients per field point (i.e. Zernike coefficients for different locations across the exposure slit illuminated by the lithographic apparatus). In this representation different field point layouts may be used. These may for example range from 5×1 points up to 13×5 points across the exposure slit (13 in the non-scanning X-direction and 5 in the scanning Y-direction).

In the next step of the method a correction is applied to the projection lens, for example using lens manipulators as described above, the correction being designed to reduce the aberrations caused by the projection lens. Finally, once this correction has taken place a lithographic substrate is exposed.

In addition to manipulating lenses of the projection system, applying the calculated correction to the lithographic apparatus may include other adjustments. Applying the calculated correction may include adjusting the position or orientation of the mask or the wafer. Applying the calculated correction may include adjusting the wavelength of the radiation used by the lithographic apparatus.

FIG. 3 depicts the prior art aberration correction method in more detail. In this representation k denotes a sample index. Inputs which affect the projection lens, and thus will induce aberrations in the projection lens are represented by u. The inputs may be considered to fall into two groups. The first group relates to the environment of the projection lens. Inputs in this first group may include the temperature of the projection lens, the pressure in the projection lens, the differential pressure at different locations in the projection lens, and the lens cooling water temperature. Inputs in the second group relate to the radiation which is being projected by the projection lens. These may be considered to be exposure setting inputs. Inputs in this second group may include the illumination mode of the radiation beam (including polarization mode) and properties of the mask such as the identity of the mask, diffraction patterns present on the mask and the transmission of the mask. The state of the projection lens, which is represented by Zernike coefficients, is denoted by y (this is the lens state description).

Measurement noise which arises during measurement of the aberrations is denoted by v. The measurement noise v is added to the lens state description y and these together provide a measured lens state description ŷ. This measured lens state description is used as input to a driver lens model which uses a lens dependency matrix that relates lens adjustments to aberrations caused by the projection lens. The relationship between the lens state description and the driver lens model may be a linear relationship. Alternatively, the relationship may be a higher order non-linear relationship. The output from the driver lens model is a set of adjustments a which are applied to the lens, thereby forming a feedback loop with the lens. In this way the projection lens is adjusted in order to reduce aberrations caused by the projection lens prior to exposure of a substrate using the projection lens.

As noted further above, in some instances the noise v may be so large that it causes an adjustment of the projection lens which increases the aberrations caused by the projection lens. This is undesirable because it reduces the accuracy with which a pattern will be projected onto a substrate by the projection lens. Embodiments of the invention address this issue.

Figure 4:
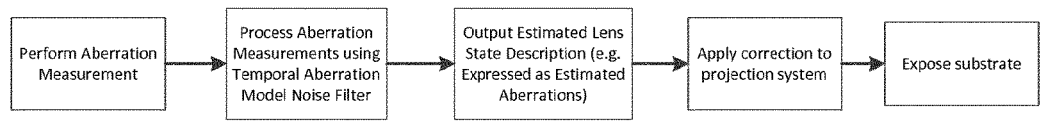
FIGS. 4 and 5 depict a method of aberration correction according to an embodiment of the invention.

FIG. 4 depicts schematically the method according to an embodiment of the invention. In the method of FIG. 4 the aberration measurements are performed in the same way (e.g. using the sensor S as described further above). An intermediate step is then performed (e.g. using a processor) in which the measured aberrations are processed using a temporal aberration model noise filter which includes a model that models the behaviour of the projection lens. The model, which is described further below, describes behaviour of the projection lens over time, taking into account inputs relating to the environment of the projection lens and inputs relating to the exposure setting being used. The model thus predicts the state of the projection lens taking into account the history of operation of the lithographic apparatus. The term "history of operation" may be considered to mean data relating to previous operation of the lithographic apparatus. The model, which may be referred to as a temporal aberration model, provides estimated values of aberrations of the projection lens. The term 'temporal aberration model' should not be interpreted as a model which is limited to a single aberration, and indeed the temporal aberration model describes a plurality of aberrations. In an embodiment the model is a dynamic model which optimises scan-integrated aberrations (i.e. integrated in the y-direction as a function of x). In an embodiment the model may be a static model which optimises non-scanned aberrations (i.e. optimises as a function of x and y).

The measured lens aberrations are processed using the temporal aberration model noise filter. This processing includes a filter which determines the extent to which the lens state which is estimated by the temporal aberration model is modified by the measured aberrations. The temporal aberration noise filter provides as an output an estimated lens state description, which may be a representation of the projection lens aberration as Zernike coefficients of different field orders (or may be some other suitable representation). The estimated lens state description may be referred to as estimated aberrations.

A correction is then applied to the projection lens, for example using lens manipulators as described above, the correction being designed to reduce the aberrations expressed in the estimated lens state description. Once the adjustment of the projection system has been performed a substrate is exposed by the lithographic apparatus.

Comparing FIGS. 2 and 4, the intermediate step of processing the aberration measurements using the temporal aberration model noise filter has been added. This intermediate step reduces the effect of measurement noise, and prevents (or reduces the likelihood of) the measurement noise from propagating into the lens state description to such an extent that it causes a correction to be applied to the projection system which mistakenly increases the aberrations caused by the projection system. In other words, processing the measured aberrations using the temporal aberration model noise filter improves the accuracy of the estimated lens state description, and thereby provides an improvement of the accuracy with which the aberrations caused by the projection system are reduced when the correction is applied. This in turn improves the accuracy with which patterns are projected from a patterning device MA onto a substrate W (see FIG. 1).

Figure 5:
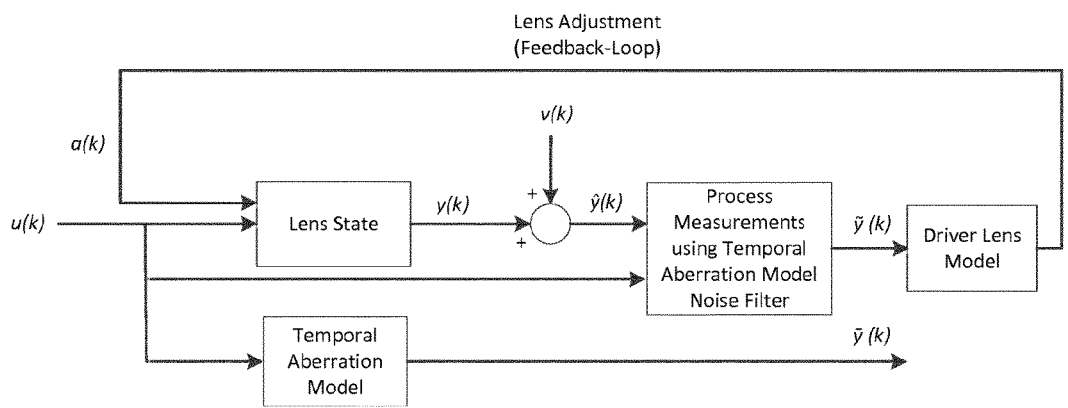

FIG. 5 depicts the method of the embodiment of the invention in more detail. Letters indicative of different inputs have the same meaning as the letters used in FIG. 3. As depicted in FIG. 5, inputs u relating to the environment of the projection lens and the exposure setting are applied to the projection lens. Adjustments a are also applied to the projection lens. The combination of the inputs u and the adjustments a determines the real lens state description y of the projection lens. Noise v inherent in the measurement of the lens state is added to the lens state to provide a measured lens state description ŷ. The inputs u are also provided to a temporal aberration model noise filter which includes a temporal aberration model that models the effect of those inputs on the projection lens. The temporal aberration model noise filter processes the measured lens state description to provide a new estimated lens state description ỹ (which may also be referred to as a modified lens state description). This estimated lens state description is used as an input to the driver lens model which determines adjustments a to be applied to the projection lens.

These adjustments are then used to adjust the state of the projection lens. It will be noted that these steps correspond with the steps that are illustrated in FIG. 4.

The method may be expressed in terms of measured and estimated aberrations. Aberrations caused by the projection lens are measured using the sensor S (this is measured lens state description ŷ). Aberrations caused by the projection lens are then estimated using a model which includes the measured aberrations as an input (this may be referred to as processing the measured aberrations). A filter determines the extent to which the model is influenced by the measured aberrations. The filter applies weightings to the measured aberrations when determining the estimated lens state. The model provides as an output an estimated lens state description ê, which may be expressed as a set of estimated aberrations. The estimated set of aberrations is used to calculate a correction which is then applied to the projection lens.

The temporal aberration model which is used as the basis for the temporal aberration model noise filter is also depicted in FIG. 5. The temporal aberration model provides the basis for a feed-forward adjustment of the projection lens. Projection lens aberration measurement samples are indicated with the index k. At a relatively high frequency (e.g. die by die instead of wafer by wafer) the driver lens model is evaluated, resulting in a feed forward adjustment of the projection lens. The input for this feed forward projection lens adjustment is the estimated lens aberration description ỹ immediately before exposure (i.e. each time a die or target portion is exposed on a wafer). Thus the temporal aberration model is evaluated using input u on a die to die basis.

The state of the temporal aberration model is updated periodically using aberration measurements (using the temporal aberration model noise filter). The aberration measurements may be measured at a lower frequency such as wafer by wafer. Thus, the temporal aberration model may be evaluated at a relatively high frequency (e.g. before exposure of each target portion) and the state of the temporal aberration model updated using aberration measurements at a lower frequency (e.g. after exposure of each wafer). Other time intervals may apply. In general, the time internal between successive evaluations of the temporal aberration model may be less than the time interval between successive updates of the state of the temporal aberration model using aberration measurements.

The temporal aberration model is periodically recalibrated. This update is at a relatively low frequency (e.g. after a lot of wafers or some other plurality of wafers has been exposed). This recalibration of the temporal aberration model is accompanied by a recalibration of the temporal aberration model noise filter (e.g. recalibration of the Kalman gain matrix, which may be based on an estimated joint-covariance matrix (as described further below)). The recalibration of the temporal aberration model may be based on open-loop data. Thus, closed-loop measurements which include the effects of adjustments a on the projection lens may have those effects removed (using the lens dependency matrix) before they are used to recalibrate the temporal aberration model.

The recalibration of the temporal aberration model may be performed using two different approaches. The first is to generate a new temporal aberration model using newly received data. For example, data generated during exposure of a lot of wafers and immediately after exposure of that lot of wafers is added to data already received, and the resulting new set of data is used to generate a new temporal aberration model. The second approach is to modify the existing temporal aberration model using newly received data. In this approach the existing temporal aberration model is retained and is merely adjusted using the newly received data.

The estimated lens state description ỹ generated using the temporal aberration model noise filter more closely reflects the actual lens state description y of the projection lens than the measured lens state description ŷ. In other words, the variance of the error between the real lens state description y and the estimated lens state description ỹ is smaller than the variance of error between the real lens state description y and the measured lens state description ŷ. As a consequence, a more accurate correction of the projection lens can be applied which in turn provides improved projection of patterns using the lithographic apparatus.

The temporal aberration model is generated using a data-driven approach. In this approach the form of the model is driven by the data itself, and as a result may be considered to have a 'black-box' form. The model is generated during a teaching phase using input data and measured aberrations for a projection lens. Subspace identification is used to generate a model which, starting from the input data, outputs aberrations that match the measured aberrations. In other words, the model correlates the inputs to the measured aberrations. An advantage of this data-driven approach is that it is capable of capturing unknown phenomena of the projection lens instead of merely attempting to model the effect of known phenomena.

The use of subspace identification is advantageous because subspace identification methods are straight-forward to implement, and in addition allow the model order to be easily deduced. An additional advantage of subspace identification is that it provides information regarding the quality of values output by the model (e.g. expressed as variance or spread, for example using a 3 sigma approach). Knowing the quality associated with estimated aberration values output from the model is advantageous because it allows discrimination between model output aberration values which can be used to improve the estimated lens state description (i.e. which will reduce the noise if they are used as substitutes for measured aberration values) and model output aberration values which will not improve the estimated lens state description (i.e. the noise associated with the model aberration values is too high and will reduce the accuracy of the lens state description).

In general, knowing the quality (which may be referred to as noise) associated with estimated aberration values allows the model to be combined with measured aberration values in a manner which reduces the total noise associated with the aberration values. This may be achieved by using a filter which takes into account the quality of the estimated aberration values. The extent to which the estimated lens state is influenced by the measured aberration values is determined by the filter. The measured aberration values may be used selectively for different aberrations to reduce the total noise present in the estimated lens state description. Where the temporal aberration model provides an estimated aberration value with a sufficiently low noise (compared with the measured aberration value), the measured aberration value may have no influence on the estimated lens state.

As mentioned further above, The lens state description used by embodiments of the invention may contain the Zernike coefficients $Z_2$ to $Z_{25}$ and the field orders: offset, tilt, curvature and third order. Thus, the lens state description may for example have 96 coefficients (24×4 coefficients).

Identification of the temporal aberration model will now be described. The temporal aberration model is a state-space linear time-invariant (SS-LTI) model. The signal generating system, which is the projection lens, can be expressed as an SS-LTI model in the following form:

$$x(k+1)=Ax(k)+Bu(k)+w(k) \quad (1)$$

$$y(k)=Cx(k)+Du(k)+v(k) \quad (2)$$

where x is the state vector (i.e. a vector indicative of the state of the projection lens), u is a vector which represents inputs (in this case lens environment inputs and exposure setting inputs), y is a vector which represents the output (i.e. the aberrations caused by the lens), w represents process noise, v represents measurement noise, and k is the sample index. The noise sequences are assumed to be zero-mean white-noise (constant power spectrum) signals that are uncorrelated to the inputs.

The identification is intended to find system matrices (A,B,C,D), the initial state of the system $x_o$, and the joint covariance matrix:

$$E\left[\begin{bmatrix} v(k) \\ w(k) \end{bmatrix} [v(j)^T \ w(j)^T] \right] = \begin{bmatrix} R & S^T \\ S & Q \end{bmatrix} \quad (3)$$

where j is also a sample index. The joint covariance matrix is not used when generating the temporal aberration model, but is applied when the temporal aberration model is used to calculate the noise filter, e.g. used to calculate the Kalman gain (see further below where equations (13) and (14) refer to elements R, S and Q of the joint covariance matrix). The initial state $x_0$ is used during validation of the model to compare the predictions of the model with measured data.

Subspace methods are used to identify the model. These methods are based on the fact that, by storing the input and output data in structured block Hankel matrices (discussed further below), it is possible to retrieve certain subspaces that are related to the system matrices of the signal generating system. With these methods estimates are found of the real system matrices (A,B,C,D) up to an unknown similarity transformation T. Since the similarity transformation T is unknown, the following system matrices are estimated:

$$A_T=AT, \ B_T=T^{-1}B, \ C_T=CT, \ D_T=D \quad (4)$$

Estimating these parameters is sufficient to know that the model has been identified sufficiently well. As noted further above, the model is a black-box model in the sense that it is not necessary to determine the internal workings of the model.

The A, C matrices and the joint covariance matrices are calculated using Canonical Variate Analysis (CVA). The CVA may be implemented in the manner described in V. Overchee and B. Moor, *Subspace identification for linear systems*. Kluwer Academic Publishers, Dordrecht, Holland, 1996. Although CVA provides the best results, other methods may be used to calculate the A, C matrices and the joint covariance matrices, for example Multivariable Output-Error State-sPace (MOESP) or Numerical algorithm for Subspace IDentification (N4SID). The MOESP algorithm may be implemented in the manner described in M. Verhaegen and V. Verdult, *Filtering and System Identification*. Cambridge University Press, 2007. Cambridge Books Online. The MOESP provides results which are very similar to results obtained using the CVA method.

The B and D matrices are also calculated. A first method of performing this calculation is based on the fact that the output can be expressed linearly in the matrices B, D and the vector $x_0$ as $$\hat{y}(k)=CA^k x_0 + (\Sigma_{\tau=0}^{k-1} u(\tau) \otimes CA^{k-\tau-1}) vec(B) + (u(k)^T \otimes I_l) vec(D) \quad (5)$$

where l is the number of outputs, $\otimes$ is the Kronecker product and the vec operator stacks all the columns of a matrix on top of each other in one big vector. This linear expression makes it possible to use a least squares method to minimize the error $$\min_{x_0,B,C} \frac{1}{N} \sum_{k=0}^{N-1} \|y(k) - \hat{y}(k)\|_2^2 \quad (6)$$

where $\hat{y}(k)$ is the prediction of the model with the already estimated A and C matrices.

A second method extracts the B and D matrices from a part of RQ factorization used in the calculation of A and C (RQ factorization is a standard factorization technique in linear algebra and is thus not described here) This method is described in V. Overchee and B. Moor, *Subspace identification for linear systems*. Kluwer Academic Publishers, Dordrecht, Holland, 1996, and is also described in M. Verhaegen and P. Dewilde, "*Subspace model identification part 1. the output-error state-space model identification class of algorithms*," International journal of control, vol. 56, no. 5, pp. 1187-1210, 1992. By applying this method, the use of Equation (5) is avoided, which significantly improves numerical performance for a large dataset (as in the present case). However, this method does not take the initial state $x_0$ into account, and this may be the cause of less accurate calculation of B and D in comparison with the other method of calculating B and D. From comparing both methods it has been found that an improvement of only a few percent in the variance accounted for (VAF–described further below) arises when using the first method compared with the second method. Since the second method is less computationally intensive this method may be considered to be preferable.

It is desirable to capture in the temporal aberration model all the effects of influences on the projection lens. In addition, it is desirable to capture all the effects of influences on the measurement setup (i.e. effects on measurement values which arise from the way in which the measurement is performed rather than from aberrations caused by the projection lens). In an embodiment, data which is used as inputs during generation of the temporal aberration model is as follows:

Polarization Shaping Element (PSE) and Polarization Changing Element (PCE)—These elements are part of the illumination system and are used to apply polarization effects to the radiation beam before it is incident upon the mask MA. In this dataset, ~4 specific combinations of these settings are used and each setting is simulated as a step input to the model.

Wafer stage identifier (ID)—In a dual stage lithographic apparatus, one wafer stage supports a substrate being measured whilst the other supports a substrate being exposed. These stages carry the number 1 or 2 as ID. Each wafer stage has its own sensor used in the measurement setup to measure the lens state description. Since there is typically an offset between these sensors, the IDs are used as a single input, with a value of 1 or 2.

Inner and outer sigma—As mentioned further above, inner and outer sigma, signify the inner and outer radius of the illumination pupil used. Both of these parameters will form their own input sequence with the range 0-1.

Lens pressure and over-pressure—These inputs concern the pressures of gas around the lens. Because these signals show natural trends, they are processed so that the affine trends are removed (also called detrending). This improves the model with respect to its VAF.

Lens temperature—This input gives the temperature of the lens. This signal also shows natural trends which are removed using detrending.

Dose and mask transmission—The amount of energy supplied to the projection lens is dependent on the dose supplied by the radiation source and the amount of light transmitted by the mask MA. The dose may for example have a range of 20-50 J/m² in the dataset. The transmission may for example have a value between 0% and 100%.

Power—The power of radiation applied to the lens from the illumination system. The power is a combination of the dose of radiation, the transmission of the mask, and the area that is illuminated by the radiation. The power input is in the form of a step sequence with the gain of the step equal to the corresponding power. A whole new input sequence is generated for each exposure setting, the sequence having steps with a gain which corresponds with the power.

There may be some coupling between inputs which are provided to the model. It may be the case that some inputs are not required because other inputs contain the same information. Thus, for example, there may be duplication between the dose and the power. Where this is the case the subspace identification methods are capable of handling this duplication (although it may cause some inefficiency of processing).

Pre-processing is applied to the input data. This may comprise removing input offsets, and removing linear trends for pressure and temperature. These trends are removed before identification of the model is performed. This avoids having to identify the trends when generating the model. The trends can subsequently be reintroduced into the model after the model has been generated. The trends can be determined easily, for example using a least squares method. Normalization of the data may also be used, for example if there is more than an order of magnitude difference between ranges of the inputs.

Taken together, in an embodiment the above may provide 14 inputs which are used for the identification procedure used to identify the temporal aberration model (described above). In this embodiment the data set used to generate the temporal aberration model is obtained during operation of the lithographic apparatus to which the temporal model will subsequently be applied (although the data set may be obtained during operation of an equivalent lithographic apparatus). The data set may be generated by exposing substrates using a variety of different exposure settings. Aberration measurements may be performed periodically (e.g. after exposure of each substrate, after exposure of each lot of substrates, or after some other interval).

The identification of the temporal aberration model based on an input data set is an iterative process. In an embodiment the steps of a single iteration are:

Pre-processing—The data may be polished by removing trends and offsets, to avoid identifying poles on the unit circle or on the origin (discussed further below). Input sequences may be normalized to avoid having to solve ill-conditioned matrices in the subspace identification methods.

Model Order Selection—The selection of the model order may be done by looking at the singular values obtained from the RQ-factorization that is done for the calculation of the A and C matrices. Moreover, model order selection may be performed based on validation results, which allows analysis regarding whether the model has been under-fitted or over-fitted.

Identification—the model is fitted to the data through the use of subspace identification.

Validation—The model is validated by analysing how well the identified model caught the dynamics from the dataset. One way in which this may be done is by using a metric referred to as Variance Accounted For (VAF), which may be expressed as follows:

$$VAF(y(k), \hat{y}(k)) = \max\left(0, \left(1 - \frac{\frac{1}{N}\sum_{k=1}^{N}\|y(k)-\hat{y}(k)\|_2^2}{\frac{1}{N}\sum_{k=1}^{N}\|y(k)\|_2^2}\right)\cdot 100\%\right) \quad (7)$$

where y is the measured aberration, $\hat{y}$ is the predicted signal, k is the sample index and N is the number of samples. The VAF has a value between 0% and 100%, the higher the VAF the lower the prediction error and the better the model. The VAF compares the lens state as predicted by the temporal aberration model with the actual measured lens state. By looking at the VAFs of the output from the model, a statement can be made about over-fitting and also about the ability of the model to predict unknown inputs.

The validation also looks at residuals, which are calculated as $$e(k)=y(k)-\hat{y}(k) \quad (8)$$

where y(k) is the measured output and 9(k) is the output generated by the model. Checking the cross-correlation of the residual to the inputs indicates whether there are any dynamics that were not caught by the model. This could be an indication that the model was under-fitted. In addition, an auto-correlation of the residuals may be performed to see if there are any other dynamics left in the signal. This could be the result of an influence from an input which has not been provided to the model, or the result of a nonlinear effect. The validation tests are based on the properties:

The sequence e(k) is a zero-mean white-noise sequence, if the identified model explains all the dynamics in y(k).

The sequence e(k) is statistically independent from the input sequence u(k), if all relations between u(k) and y(k) are captured in the identified model.

The above cycle is iterated a plurality of times (e.g. several times) in order to obtain a temporal aberration model which satisfactorily captures the dynamics from the data set. In other words, iterations of the cycle are performed until the output from the model reflects sufficiently accurately the aberrations which are caused by the projection lens. That is, until the model correlates the inputs to the measured aberrations sufficiently accurately.

To identify a correct model of a system (in this case the lithographic apparatus), the data set must contain enough information about the system. For this reason, the data must have been recorded when the system was excited. This is referred to as persistency of excitation.

A check for persistency of excitation may be performed using a Hankel matrix of the inputs to the system. The A and C matrices are extracted from part of the space of this matrix (i.e. a subspace is extracted from the Hankel matrix). To ensure that this subspace can be extracted a Hankel matrix of the inputs is needed which has an order of at least n+s*2, where n is the model order and s the amount of rows in the Hankel matrix. If this is the case then the system is excited enough to make correct estimations of the system. The Hankel matrix for the input u is constructed as follows $$U_{i,s,N} = \begin{bmatrix} u(i) & u(i+1) & \ldots & u(i+N-1) \\ u(i+1) & u(i+2) & \ldots & u(i+N) \\ \vdots & \vdots & \ddots & \vdots \\ u(i+s-1) & u(i+s) & \ldots & u(i+N+s-2) \end{bmatrix} \quad (9)$$

where N is the number of input samples. The model orders (n) used in the identification cycle vary between 1 and 8 (although values larger than 8 are possible). As noted above, for the input to remain persistently excited the Hankel matrix must have an order of at least n+2*s. The number of rows in the Hankel matrix s is chosen to be 3×n(3×8=24), and the Hankel matrix must be of order 54 (8+2*24=54). In practice, the inputs generally provide significantly higher orders of excitation than order 54. Thus, persistency of excitation can be expected.

In an embodiment, to ensure persistency of excitation the temporal aberration model and derived noise filter is recalibrated after every lot of wafers has been exposed. As explained further below, this recalibration may comprise generation of an entirely new temporal aberration model using newly recorded data in combination with previously recorded data. Alternatively, the recalibration may comprise updating the existing temporal aberration model to take into account newly recorded data.

When a new exposure setting is used (e.g. an illumination mode is used which has not previously been used by the lithographic apparatus) the already running temporal aberration model does not contain information relating to that exposure setting. In an embodiment, during exposure of a first lot using that new exposure setting the temporal aberration model noise filter is not used, and instead the measured aberrations are exclusively used for controlling the lens adjustment during exposure of the first lot. After a lot of wafers has been exposed using the new exposure setting, the temporal aberration model is recalibrated using data relating to that exposure setting. The temporal aberration model is then used to process measured aberrations during exposure of subsequent lots of wafers using that exposure setting.

If the new exposure setting relates to a new mask which has not been previously used by the lithographic apparatus in combination with an illumination mode which has been used by the lithographic apparatus, it may be possible to use the temporal aberration model noise filter during exposure of the first lot using the new exposure setting (the new mask is likely to have a much smaller effect upon the temporal aberration model noise filter than a new illumination mode).

In an alternative approach, a temporal aberration model can be imported from another lithographic apparatus (e.g. one which has already used the exposure setting). This alternative approach may provide improved lens aberration control during exposure of a first lot of wafers using a new exposure setting.

In an example embodiment of the invention a temporal aberration model was generated using a data set from an ASML NXT2 lithographic apparatus (this is a dual stage DUV lithographic apparatus). The data set comprised input data and measured aberrations (lens state description) generated over period of 10 days.

Figure 6:
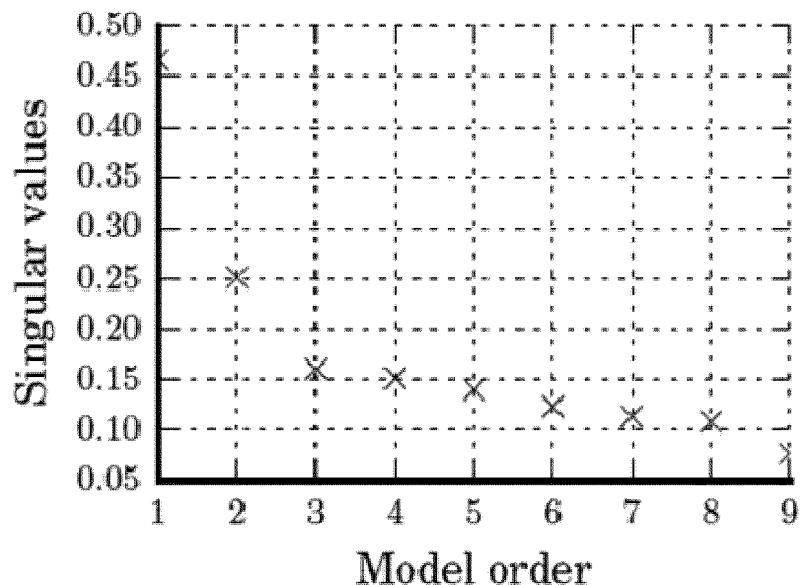
FIGS. 6 and 7 are graphs relating to selection of the order of a model used by an embodiment of the invention.

As explained further above, the model order of the temporal aberration model was selected, this selection being done by looking at the singular values obtained from the RQ-factorization that was performed for the calculation of the A and C matrices. FIG. 6 depicts singular values as a function of model order number obtained for the data set obtained from the ASML NXT2 lithographic apparatus. The singular values indicate that the appropriate model order in this instance is approximately 2 (the first two model orders are the most excited).

Figure 7:
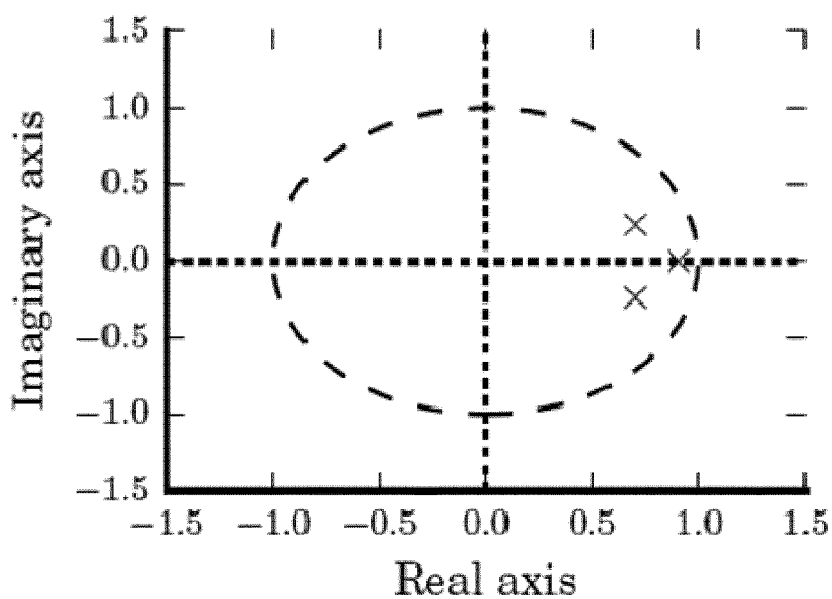

The data set used to generate the temporal aberration model was non-uniformly sampled in time. This is because aberration measurements are performed after each substrate exposure but the delay between successive exposures of substrates will not always be uniform. Linear interpolation is applied to the data set in order to facilitate generation of the model. The sampling period for this interpolation may be selected based on pole locations of the identified model (the sampling time is determined iteratively). If the sampling time is too long then information will be lost from the model. Conversely, if the sampling time is too short then the model will attempt to fit to features which are not in fact present in the data (in which case the model becomes unstable). FIG. 7 is a pole map which depicts poles of the model. If the poles are at or close to the unit circle then the sampling time is too short and should be increased. If the poles are at or close to the origin then the sample time is too long and should be reduced. FIG. 7 is the pole map for Zernike $Z_{7,3}$ with a sampling time of 43.3 sec. In this instance the poles are relatively close to the unit circle. However, because of cases where there is much noise, it is desirable to use as much of the samples as possible. The average sampling time of the dataset was 14.4 sec. A sampling time of 43.3 sec (integer multiple of 14.4 sec) was used. This sampling time has been verified as providing good results. Other sampling times may be used. Selection of a sampling time (which may also be expressed as a sampling frequency) is described in M. Verhaegen and V. Verdult, *Filtering and System Identification*. Cambridge University Press, 2007.

Figure 8:
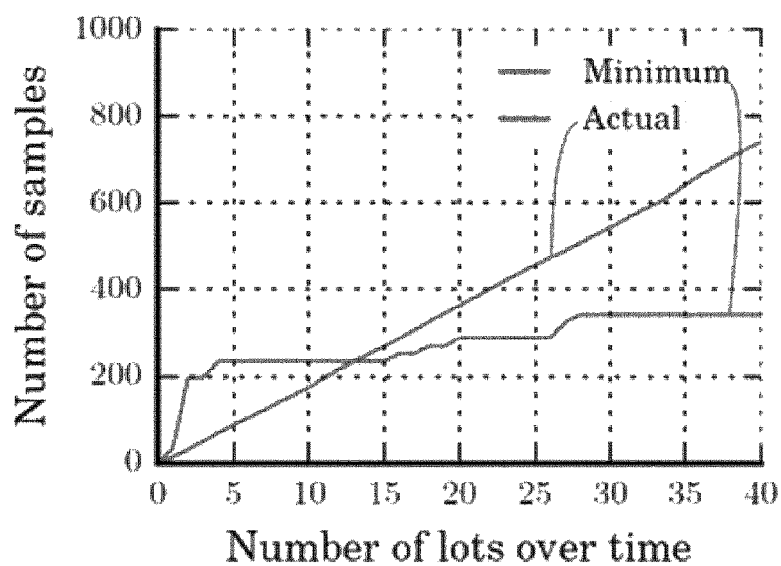
FIG. 8 is a graph which illustrates how a series of substrate exposures may be needed as inputs before the model is calculated.

As explained further above in connection with the Hankel matrix, persistency of excitation is needed in order to generate the temporal aberration model. This may ensure that the data is rich enough to prevent numerical errors. A minimum amount of samples needed to generate the temporal aberration model may be expressed as $$N_{min}=2(m+l)s+2s \quad (10)$$

where m, l and s are respectively the number of inputs, outputs and rows in the Hankel matrices used for identification. Here, l is always 1 but the amount of inputs m increases over time as more and more different exposure settings are used. In FIG. 8, $N_{min}$ is plotted together with the actual number of samples N over time. From this plot, it is seen that in this particular case, the actual number of samples exceeds the minimum number of samples after 13 lots of substrates. This 13 lots includes various different exposure settings.

Once the temporal aberration model has been generated (using the above described method), the model is incorporated into a temporal aberration model noise filter which is used to estimate the lens state during operation of the lithographic apparatus. The estimation of the lens state includes as an input the aberrations as measured by the sensor S of the lithographic apparatus. This may be referred to as processing of the measured aberrations. The processing uses a filter. The filter facilitates the generation of a new estimated aberration value using the measured aberration and the estimated (predicted) state of the lens (the estimated state of the lens provides information about ongoing dynamics in the lens, from which an aberration value is a static subset of information).

The filter comprises weightings which are applied during the processing of the aberration values, the weightings being determined based on the accuracy (reproducibility) of the measured aberration values and the accuracy of the temporal aberration model (as described further below). The processing of the measured aberration may be referred to as noise reduction, because the processing is intended to provide estimated aberration values which are improved compared with noisy aberration values obtained from the sensor S.

The processing (noise reduction) is achieved by applying a Kalman filter together with the temporal aberration model (although other forms of filter may be used by embodiments of the invention). The Kalman filter for a system of the type set out in Equations (1) and (2) is generally used to optimally observe the states of the system through its measured inputs and outputs, where the real system is known (system matrices given). Here, optimal means that it gives a zero mean estimate with minimal variance. Moreover, because the signal generating system is assumed to be time-invariant, the Kalman filter is stationary and can be expressed as a gain K, also referred to as the Kalman-gain. Information relating to the Kalman filter may be found in M. Verhaegen and V. Verdult, *Filtering and System Identification*. Cambridge University Press, 2007. Cambridge Books Online.

The following model, which may be referred to as an innovation predictor model, is used:

$$\hat{x}(k+1)=A\hat{x}(k)+Bu(k)+K(y(k)-C\hat{x}(k)) \quad (11)$$

$$\hat{y}(k)=C\hat{x}(k)+Du(k) \quad (12)$$

in which $\hat{x}$ is the state vector, u is the inputs to the model (discussed above), y is the measured lens state descriptor (i.e. measured aberrations which may be expressed as Zernike coefficients), $\hat{y}$ is the lens state descriptor output from the model (i.e. estimated aberrations which may be expressed as Zernike coefficients generated by the model), and k is the sample index. K is the Kalman gain of the system. Equation (11) describes how the state vector is updated by the model using the measured aberrations. Thus, the state of the lens is determined by the model, including using the measured aberrations as an input. Equation (12) describes how the state vector is translated into estimated aberrations. Thus, the innovation predictor relates the internal lens model state $\hat{x}$ to the estimated aberrations $\hat{y}$.

Using the estimated joint covariance matrix, Equation (3), the Kalman gain can be calculated by solving the Discrete Algebraic Riccati Equation (DARE)

$$P=APA^T+Q-(S+APC^T)(CPC^T+R)^{-1}(S+APC^T)^T \quad (13)$$

$$K=(S+APC^T)(CPC^T+R)^{-1} \quad (14)$$

where P is the variance on the error between the real state and the estimated state through the predictor model. A & C are the system matrices which follow from the identification process. Q, S & R are elements of the joint covariance matrix.

The innovation predictor model based on the temporal aberration model from Equations (11) and (12) is used with the calculated Kalman-gain to reduce noise on the lens state description (processing the measured aberration values using the model and the Kalman-gain provides estimated aberration values with reduced noise). This may be referred to as the temporal aberration model noise filter. Using the temporal aberration model noise filter to process measured aberration values is depicted in FIG. 5.

The temporal aberration model is identified as a Multi-Input Single-Output (MISO) system. In the same way, the temporal aberration model noise filter is applied such that every lens state descriptor coefficient (e.g. each aberration, which may be expressed using Zernike coefficients) has its own unique filter. Hence, for the temporal aberration model noise filter the temporal aberration model is identified and, based on the estimated joint covariance matrix, the Kalman-gain is then calculated. The combination of the temporal aberration model and the Kalman gain provides the temporal aberration noise filter (this is the innovation predictor model).

The Kalman-gain determines the weighting applied when generating a new aberration value using the measured aberration and the estimated lens state (as determined using the temporal aberration model). For example, if the Kalman-gain is zero then the estimated aberration is entirely determined by the estimated lens state (the measured aberration has no influence on the estimated aberration). For non-zero Kalman-gain values, the new (estimated) aberration is influenced by both the measured aberration and the estimated lens state from the temporal aberration model. As the Kalman gain value increases, the weight associated with the estimated lens state reduces, i.e. the relative influence of the estimated lens state compared with the measured aberration is reduced when determining the estimated aberration. The Kalman gain may be sufficiently large that the weight associated with the estimated lens state is zero (i.e. the measured aberration is not changed using the estimated lens state). In this instance the adjusted aberration corresponds with the measured aberration.

In general terms, the system identification process provides the system matrices (A, B, C, D), the initial state and the joint covariance matrix. The system matrices and the joint covariance matrix are then used to calculate the Kalman-gain. In an embodiment this calculation is performed for each of 24 Zernikes multiplied by 4 field order outputs (i.e. the calculation is performed 96 times).

After exposure of each lot the temporal aberration model may be recalibrated and a new noise filter calculated. The measurement data which is the input for this recalibration of the temporal aberration model is a set of preceding lots. In this set multiple lots with the same exposure setting can exist. Having more measurement data for an exposure setting is beneficial for the temporal aberration model noise filter performance during exposure of wafers using that exposure setting.

The temporal aberration model may be evaluated before exposure of each target portion of a substrate (e.g. before exposure of each die). The result of the evaluation is used by the driver lens model to adjust the project lens before exposure of the target portion. When new aberration measurements are performed (e.g. after exposure of each wafer or after exposure of a plurality of wafers) the aberration measurements are used to update the state of the temporal aberration model (as described above). The temporal aberration may then be subsequently evaluated a plurality of times before further aberration measurements are performed (e.g. evaluated before exposure of each target portion).

If an exposure setting is used by the lithographic apparatus that was previously used during generation of the temporal aberration model then the temporal aberration model can be used immediately during exposure of wafers using that exposure setting (instead of for example waiting for one lot and then performing a recalibration of the temporal aberration model). This may occur for example if a first exposure setting is used by the lithographic apparatus for a series of lots, followed by a second exposure setting, and the first exposure setting is once again used by the lithographic apparatus.

In an embodiment, a learning algorithm is used to recalibrate the temporal aberration model used in the noise filter after every lot of substrates (in other embodiments some other interval may be used). The steps of the learning algorithm, plus the application of the temporal aberration model noise filter are as follows:

1. Gathering initial input/output data—Data is gathered during exposure of the lot of wafers, and is then used to recalibrate the temporal aberration model. This may be a full recalculation of the temporal aberration model or may be an incorporation of the new data into the existing temporal aberration model.

2. Calculating the temporal aberration model noise filter—Once the temporal aberration model has been recalibrated the temporal aberration model noise filter can be calculated. This is done by computing the Kalman-gain based on the estimated joint-covariance matrix. Placing the identified system matrices together with the Kalman-gain in the innovation predictor model provides the temporal aberration model noise filter. In an embodiment, the model order used in the identification of the temporal aberration model is 3, and the number of rows s in the Hankel matrices is 9. The sampling time used to generate the temporal aberration noise filter (i.e. to calculate the Kalman-gain using the estimated joint-covariance matrix) is chosen using the method described above to avoid over sampling or under sampling. The sampling time may for example be 43.2 sec. The sampling time may generally be of the order of tens of seconds. The temporal aberration model noise filter is then calculated. The time taken to calculate the temporal aberration model noise filter may for example be a couple of minutes, or may be less than this.

3. Apply the temporal aberration model noise filter—Once the temporal aberration model noise filter has been calculated it can be used to process aberration measurements. That is, measured aberration values are used to update the estimated lens state, and the estimated lens state is in turn used to provide a new (estimated) set of aberration values. The extent to which estimated aberration values which are output by the model correspond with measured aberration values is determined by the Kalman-gain (as explained above). To prevent measured aberration values being replaced with worse aberration estimations generated by the temporal aberration model noise filter, each new estimation of aberration values is verified. In case of verification failure, the measured aberration value is used instead of the estimated aberration value. First, the variance of the noise on the measurement signal is estimated. This is done by calculating the standard deviation on the residuals $$e(k)=y(k)-\hat{y}(k) \qquad (15)$$

where y(k) is the measured output sequence and ŷ(k) is the predicted output sequence using the identified temporal aberration model. The standard deviation is calculated as $$\sigma=\sqrt{E[(e(k)-\mu)^2]}, \mu=E[e(k)] \qquad (16)$$

where E is the mean function and μ the mean of e(k). If the filter estimation of the aberration value is not within three times the standard deviation (also called the 3σ) of the measured aberration value, which is the 99.7% confidence interval where the real aberration must be, the measurement is chosen over the filter estimate.

4. Recalibrate the temporal aberration model and the temporal aberration model noise filter—The temporal aberration model noise filter is recalibrated periodically. Since the calculation time for a complete temporal aberration model noise filter in this example takes a couple of minutes, the temporal aberration model noise filter is recalculated during exposure of the next lot of substrates (which may take around five minutes). In this example, the data on which the active temporal aberration model noise filter is based will always lag behind by the length of a lot compared to the data that is available. In general, recalibration of the temporal aberration model noise filter may be performed after any suitable interval. The minimum interval will in part be determined by the processing power of the processor performing the calculation and in part be determined by the complexity of the calculation. Recalibration of the temporal aberration model noise filter for a given exposure setting will become more computationally expensive as more lots are exposed using that exposure setting (the amount of data to be computed increases). For this reason a moving window of a given number of lots may be used to perform the calculation. For example, a moving window of the previous 200 lots may be used when more than 200 lots have been exposed. The moving window may be for any suitable number of lots. The moving window may be based on some other metric (e.g. the total number of substrates exposed using the exposure setting).

Parts of the temporal aberration model noise filter may be fixed. That is, they may be unchanged irrespective of the exposure settings being used by the lithographic apparatus. For example, for some Zernike coefficients a determination may be made prior to operation of the lithographic apparatus that the measured values for that Zernike coefficient will never be replaced with values estimated using the model. This may be done for example if it is known that the model will never provide an estimated value for that Zernike coefficient which is better than the measured value. The Kalman-gain value is set accordingly and does not change over time. This may be the case for example for Zernike coefficient $Z_{9,2}$.

Figure 9:
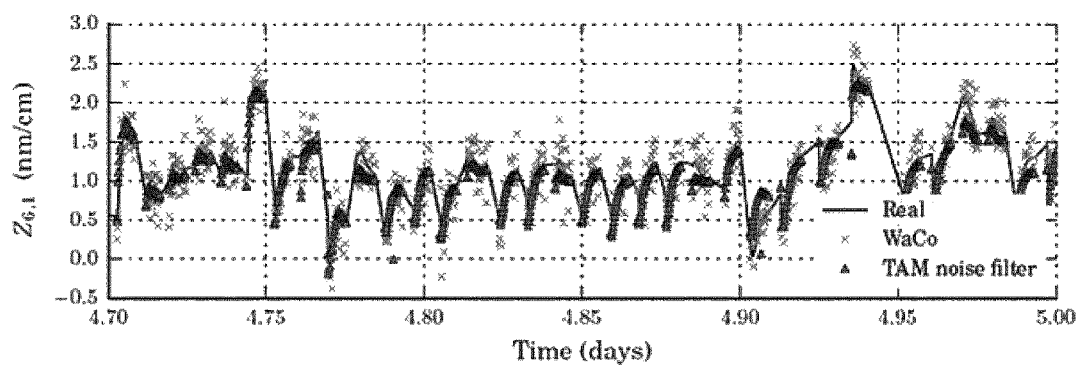
FIG. 9 is a graph which compares measured aberrations with aberrations calculated using an embodiment of the invention.

FIG. 9 depicts the performance of the temporal aberration model noise filter for Zernike $Z_{6,1}$ in this example, as can be seen, the temporal aberration model noise filter provides aberration values (labelled as TAM noise filter) which more closely match the actual aberration values than the measured aberration values (labelled as WaCo).

Examples of results are also provided in Tables 1 and 2, in which the noise to excitation ratios are also given, calculated as where $\sigma_{noise}$ is the standard deviation of the noise in the measured aberration values and $\sigma_{excitation}$ the standard deviation of the aberrations estimated by the model.

$$\text{Noise/excitation ratio} = \frac{\sigma_{noise}}{\sigma_{excitation}} \quad (17)$$

For a given aberration the noise is calculated by subtracting the estimated aberration value from the measured aberration value. The standard deviation of the noise is determined by analysing these noise values as calculated over a period of time. For the same aberration, the standard deviation of the excitation is determined by analysing the aberration values output from the temporal aberration model over a period of time. The noise/excitation ratio is thus indicative of the performance of the embodiment over a period of time.

When the values of the noise excitation ratios are compared with the performance improvement provided by the temporal aberration model noise filter, it can be seen that these values are directly related. Hence, when there is almost no noise compared to the excitation of the signal the temporal aberration model noise filter will be less accurate than the measurements. This is due to the fact that in these cases, the error in the model estimation is bigger than the error caused by the noise. Moreover for these cases, no noise filter is needed (the measurements have almost no noise). This is why an approach is used in which the temporal aberration model noise filter is effective when necessary.

A threshold may be set for determining whether an estimated aberration value generated using the model is more accurate than a measured aberration value. The threshold may for example be based on the noise/excitation ratio expressed as a percentage. The threshold may for example be 10% (i.e. the estimated value more accurate used if the noise/excitation ratio is greater than 10%). The threshold may be any other suitable value, and may be different for different lithographic apparatus.

In a few cases, a result of minus infinity is output in this embodiment. This is due to some instability in the temporal aberration model noise filter. However, this is not an issue because this occurs only in the situations where noise is almost absent from the measurements (i.e. it occurs only for values in which no benefit would be provided by replacing a measured aberration with an aberration estimated by the model). Modifying the model in a known manner to remove the instability may be performed using known mathematical techniques.

TABLE 1

Performance of TAM noise filter for spherical aberrations

| LSD coefficient | Measurement σ | Noise reduction (%) | Noise/ excitation ratio (%) |
|---|---|---|---|
| $Z_{9,0}$ | (nm) | 5.58 | 8.37 |
| $Z_{9,1}$ | (nm/cm) | 30.77 | 17.85 |
| $Z_{9,2}$ | (nm/cm$^2$) | -102.29 | 6.79 |

TABLE 1-continued

Performance of TAM noise filter for spherical aberrations

| LSD coefficient | Measurement σ | Noise reduction (%) | Noise/ excitation ratio (%) |
|---|---|---|---|
| $Z_{9,3}$ | (nm/cm$^3$) | 32.41 | 10.94 |
| $Z_{16,0}$ | (nm) | -90.05 | 6.27 |
| $Z_{16,1}$ | (nm/cm) | 42.50 | 41.34 |
| $Z_{16,2}$ | (nm/cm$^2$) | -51.77 | 9.44 |
| $Z_{16,3}$ | (nm/cm$^3$) | 43.42 | 30.18 |
| $Z_{25,0}$ | (nm) | -10.03 | 6.43 |
| $Z_{25,1}$ | (nm/cm) | 50.07 | 49.10 |
| $Z_{25,2}$ | (nm/cm$^2$) | 28.16 | 18.99 |
| $Z_{25,3}$ | (nm/cm$^3$) | 54.90 | 36.29 |

TABLE 2

Performance of TAM noise fitler for coma aberrations

| LSD coefficient | Measurement σ | Noise reduction (%) | Noise/ excitation ratio (%) |
|---|---|---|---|
| $Z_{7,0}$ | (nm) | 44.80 | 56.37 |
| $Z_{7,1}$ | (nm/cm) | -47.81 | 3.94 |
| $Z_{7,2}$ | (nm/cm$^2$) | 62.02 | 60.89 |
| $Z_{7,3}$ | (nm/cm$^3$) | -29.67 | 10.68 |
| $Z_{8,0}$ | (nm) | -65.02 | 7.79 |
| $Z_{8,1}$ | (nm/cm) | 42.74 | 25.07 |
| $Z_{8,2}$ | (nm/cm$^2$) | 27.26 | 22.22 |
| $Z_{8,3}$ | (nm/cm$^3$) | 51.93 | 27.75 |
| $Z_{14,0}$ | (nm) | 59.08 | 39.93 |
| $Z_{14,1}$ | (nm/cm) | 17.07 | 10.03 |
| $Z_{14,2}$ | (nm/cm$^2$) | 46.17 | 36.33 |
| $Z_{14,3}$ | (nm/cm$^3$) | 13.52 | 15.58 |
| $Z_{15,0}$ | (nm) | -∞ | 10.33 |
| $Z_{15,1}$ | (nm/cm) | 51.68 | 44.64 |
| $Z_{15,2}$ | (nm/cm$^2$) | 32.30 | 25.60 |
| $Z_{15,3}$ | (nm/cm$^3$) | 56.47 | 64.81 |
| $Z_{23,0}$ | (nm) | 44.70 | 34.80 |
| $Z_{23,1}$ | (nm/cm) | -24.56 | 15.64 |
| $Z_{23,2}$ | (nm/cm$^2$) | 28.35 | 17.60 |
| $Z_{23,3}$ | (nm/cm$^3$) | 34.88 | 16.11 |
| $Z_{24,0}$ | (nm) | -8.30 | 22.13 |
| $Z_{24,1}$ | (nm/cm) | 62.66 | 59.17 |
| $Z_{24,2}$ | (nm/cm$^2$) | 21.02 | 37.51 |
| $Z_{24,3}$ | (nm/cm$^3$) | 60.11 | 58.45 |

The temporal aberration model includes some assumptions. The first assumption is that the relationship between adjustments of the lenses and the aberrations are perfect. This relationship may be referred to as lens dependency. Although in practice the lens dependencies may not be perfect, lens dependency errors may be sufficiently small that they do not have a significant impact upon embodiments of the invention (for example the lens dependency errors may be smaller than errors caused by the accuracy of manipulators used to manipulate the lenses). Lens dependency errors may scale with the size of adjustments applied to the lenses.

The temporal aberration model also assumes that the noise which arises from the aberration measurements has characteristics which stay the same over a period of time and that the noise has a Gaussian distribution.

The numerical aperture of the projection lens will have an influence upon the wavefront which is projected by the projection lens. This is because the numerical aperture (NA) acts as a low-pass filter on the wavefront. When the numerical aperture of the lens is reduced this will mean that information about the aberrations on outer fringes of the wavefront are not measured. As a result, the lens state description which is measured will be different for different numerical apertures. However, it is possible to model the lens state description of a projection lens with a reduced numerical aperture if the lens state description for a larger numerical aperture of the projection lens has been measured and provided as an input to the temporal aberration model. Therefore, in an embodiment, measurements of the lens state description may be performed with the numerical aperture of the projection lens set to its maximum value. A reduced numerical aperture may then be used to expose substrates. The temporal aberration model used to estimate the lens state description (and thus to apply adjustments to the projection lens) may be adjusted to provide outputs which model the projection lens with the reduced numerical aperture. The measurement performed with the maximum numerical aperture may for example be repeated after each lot of substrates is exposed, or may be repeated after some other interval.

As noted above, the history of the lithographic apparatus is taken into account when determining whether or not to process aberration measurements using the temporal aberration model noise filter. For example, when a new exposure setting is being used to expose a pattern (e.g. a mask with a pattern which has not previously been used in the lithographic apparatus), the temporal aberration model noise filter is not used to process aberration measurements during initial substrate exposures which use the new exposure setting. Instead, aberration measurements are gathered over a period of time (e.g. during exposure of a lot of substrates) and are used to generate a new set of lens state descriptions for the temporal aberration model. This may be referred to as recalibrating the temporal aberration model. A new noise filter is also calculated. The temporal aberration model noise filter is then used to process aberration measurements during subsequent exposures which use that exposure setting (e.g. during exposure of subsequent lots of substrates using that exposure setting).

The above described embodiment of the invention may apply processing to aberration measurements performed by the lithographic apparatus after exposure of each substrate, thereby generating an updated estimated lens state which takes into account the aberration measurements. The estimated lens state may in addition be updated before exposure of each target portion of each substrate. These more frequent updates do not use new aberration measurements but instead merely evaluates the model to reflect predicted behaviour of the lens. The model provides a lens state description (e.g. expressed as estimated aberration values) which is then used by the driver lens model to adjust the lens before exposure of the target portion. Other intervals between aberration measurements and other intervals between evaluations of the model may be used.

The lithographic apparatus may perform more aberration measurements after exposure of a lot of substrates than after exposure of a substrate (more time is available and this allows more measurements to be performed). Where this is the case, the temporal aberration model noise filter may take into account the additional aberration measurements.

In the above described embodiment aberrations are measured, processing is applied to the aberration measurements, and then the resulting new set of estimated aberrations are used to calculate adjustments to be applied to the projection lens. In an alternative embodiment the model is used to predict the state of the lens and adjustments are applied to the lens based on that prediction before aberration measurements are performed. The aberration measurements are performed and processing is then applied to the measured aberrations. The resulting new estimated set of aberration values is then used to apply a further adjustment to the projection lens. This may be expressed as follows:

1. At sample step k−1, a prediction was made of the lens state description (LSD) at step k.
2. Using the predicted LSD apply a correction at step k.
3. Now measure the LSD at step k (this provides smaller aberrations in the projection lens provided that the temporal aberration model is a good model of the lens).
4. Apply a correction at step k based on the modified measured aberrations (generated using the temporal aberration model noise filter as described above), this correction is then smaller provided that the model gave a good prediction.
5. Restart procedure for step k+1.

As will be appreciated, in such an embodiment two adjustments of the projection lens are performed during each cycle (e.g. before a substrate is exposed). An advantage of this approach is that because the aberrations that are measured by the sensor are smaller, the errors (noise) associated with those measurements will correspondingly be reduced.

The following shows two ways to incorporate new aberration measurements and make a useful prediction of the next step. The two prediction methods are as follows:

1. In the identification of temporal aberration model, use the input sequence u(k) and the output sequence y(k), where k is the sample index. Then identify a Linear Time-Invariant (LTI) model of the form $$x(k+1)=Ax(k)+Bu(k) \tag{18}$$

$$y(k)=Cx(k)+Du(k) \tag{19}$$

where x are the states of the system and A,B,C,D are the system matrices. Instead of identifying such a model, a model could also be identified as $$x(k+1) = Ax(k) + B\begin{bmatrix} u(k+1) \\ y(k) \end{bmatrix} \tag{20}$$

$$y(k+1) = Cx(k) + D\begin{bmatrix} u(k+1) \\ y(k) \end{bmatrix} \tag{21}$$

This uses shifted versions of the input and output for training, and feeds the unshifted output as an input. In this form the model is causal and is trained to predict the next time step. In the same manner, specialized models can be also trained for the n'th step.

2. As explained further above, the innovation predictor model is used with the Kalman gain to estimate the states of the already identified temporal aberration model. By making a small modification to Equation (12) of this model the next step can be predicted. The modified innovation predictor model for one time step ahead prediction is $$\hat{x}(k+1)=(A-KC)\hat{x}(k)+(B-KD)u(k)+Ky(k) \tag{22}$$

$$\hat{y}(k+1)=C\hat{x}(k+1)+Du(k+1) \tag{23}$$

Embodiments of the invention may be used to provide fault detection. Fault detection can be achieved in three steps. The first step is estimating the standard deviation on residuals between measured aberrations and the aberrations predicted by the temporal aberration model. The second step is calculating a confidence interval based on the standard deviation of the residuals and a one step ahead prediction. The third step is verifying that the measured aberrations are within this confidence interval. Performing this verification provides a way of detecting unusual behaviour or faults. For example, a fault that could be detected early in the process is a drop of water on the projection lens, which can cause a jump in certain aberrations.

A further advantage of the verification is that it provides an indication of whether the lithographic apparatus is continuing to operate correctly (e.g. within predetermined tolerances). The lithographic apparatus can thus be operated indefinitely whilst ensuring that it remains within predetermined tolerances. This avoids a possible need to periodically reset the lithographic apparatus. Such a reset may comprise returning lens manipulators to positions which they had immediately after a wide range of aberration data was measured during an interruption of operation of the lithographic apparatus (a so-called system correction). Avoiding this reset is advantageous because continuous operation of the lithographic apparatus using the verified model provides better aberration reduction than applying a periodic reset (the verified model includes significantly more data than the data measured during the interruption of operation and thus provides more accurate aberration reduction).

A model developed using a given lithographic apparatus can be imported to another lithographic apparatus. This may for example be another lithographic apparatus with the same characteristics—e.g. also dual stage and with the same maximum numerical aperture.

Although the above description explains one way in which the temporal aberration model can be generated, the temporal aberration model may be generated in any suitable manner. For example, the temporal aberration model may be generated using a lens heating model (i.e. a model which models the effect upon the projection lens of heat delivered to the projection lens). Lens heating can be modelled using the curve $$y_{i,j}(t) = P_j \left\{ \mu_1^{(i,j)} \left(1 - e^{-\frac{t}{\tau_1^{(i,j)}}}\right) + \mu_2^{(i,j)} \left(1 - e^{-\frac{t}{\tau_2^{(i,j)}}}\right) \right\} \quad (24)$$

where the curve describes a single Zernike coefficient with a certain field order over time, denoted by i. The index j denotes that the curve is for a specific reticle and illumination setting, which we from now on call the exposure setting. P represents the power applied to the lens through the illuminator and $\tau_1^{(i,j)}$, $\tau_2^{(i,j)}$, $\mu_1^{(i,j)}$, $\mu_2^{(i,j)}$ are the LH parameters that are acquired by fitting the LH curve to a dataset.

The lens heating curve can be described by a state space model as $$\dot{x}_{i,j} = \begin{bmatrix} -\frac{1}{\tau_1} & 0 \\ 0 & -\frac{1}{\tau_2} \end{bmatrix}_{A_{i,j}} x_{i,j} + \begin{bmatrix} \frac{\mu_1}{\tau_1} \\ \frac{\mu_2}{\tau_2} \end{bmatrix}_{B_{i,j}} P_j, \quad y_{i,j} = \underbrace{[1 \ 1]}_{C_{i,j}} x_{i,j} \quad (25)$$

where x represents the state of the lens heating aberration at a time instance. For a full lens state description of the lens heating aberrations, all the different Zernike coefficients of every field order are combined in one state space model. This is done as follows $$\dot{x}_j = \underbrace{\begin{bmatrix} 0 & A_{2,j} & \cdots & 0 \\ \vdots & \vdots & \ddots & \vdots \\ 0 & 0 & \cdots & A_{N,j} \end{bmatrix}}_{A_j} x_j + \underbrace{\begin{bmatrix} B_{1,j} \\ B_{2,j} \\ \vdots \\ B_{N,j} \end{bmatrix}}_{B_j} P_j \quad (26)$$

$$y_j = \underbrace{\begin{bmatrix} C_{1,j} & 0 & \cdots & 0 \\ 0 & C_{2,j} & \cdots & 0 \\ \vdots & \vdots & \ddots & \vdots \\ 0 & 0 & \cdots & C_{N,j} \end{bmatrix}}_{C_j} x_j \quad (27)$$

where N is the number of coefficients in the lens state description to describe lens heating aberrations. This model represents a description of the lens heating effects for a single exposure setting. The lens heating model should accommodate different exposure settings. The accommodating model is computed as $$\dot{x} = \begin{bmatrix} A_1 & 0 & \cdots & 0 \\ 0 & A_2 & \cdots & 0 \\ \vdots & \vdots & \ddots & \vdots \\ 0 & 0 & \cdots & A_M \end{bmatrix} x + \begin{bmatrix} B_1 & 0 & \cdots & 0 \\ 0 & B_2 & \cdots & 0 \\ \vdots & \vdots & \ddots & \vdots \\ 0 & 0 & \cdots & B_M \end{bmatrix} [P_1 \ P_2 \ \cdots \ P_M] \quad (28)$$

$$y = [C_1 \ C_2 \ \cdots \ C_M] x \quad (29)$$

where M is the number of different exposure settings. In this model every exposure setting has its own power input $P_j$.

As noted further above, recalibration of the temporal aberration noise filter may comprise a full recalculation of the temporal aberration model (e.g. using the calculation described above). In an alternative approach, the temporal aberration model may be recalibrated by adding a smaller identified model which is based on newly received data. Where this is the case an update equation used to recalibrate the temporal aberration model may have the form $$\begin{bmatrix} \dot{x}_{TAM} \\ \dot{x}_{new} \end{bmatrix} = \begin{bmatrix} A_{TAM} & 0 \\ 0 & A_{new} \end{bmatrix} \begin{bmatrix} x_{TAM} \\ x_{new} \end{bmatrix} + \begin{bmatrix} B_{TAM} & 0 \\ 0 & B_{new} \end{bmatrix} \begin{bmatrix} u_{TAM} \\ u_{new} \end{bmatrix} \quad (30)$$

$$y_{LSD} = [C_{TAM} \ C_{new}] \begin{bmatrix} x_{TAM} \\ x_{new} \end{bmatrix} + [D_{TAM} \ D_{new}] \begin{bmatrix} u_{TAM} \\ u_{new} \end{bmatrix} \quad (31)$$

where the variables with the subscript—TAM—are system variables of the existing model and the variables with the subscript—new—are system variables of the identified model based on the new data. This alternative approach may be used for example when the newly received data relates to an exposure setting which already forms part of the temporal aberration model. A full recalculation of the temporal aberration model may be used when the newly received data relates to an exposure setting which does not form part of the temporal aberration model. Thus, the selection of the approach used to recalibrate the temporal aberration model may take into account the history of the lithographic apparatus.

In the above description the terms "lens state" and "lens state description" are used. These may be considered to be examples of the more general "lithographic apparatus state" and "lithographic apparatus state description". The lithographic apparatus state may include information which may be considered not to form part of the lens state (e.g. information relating to the position or identity of a substrate table). Although embodiments of the invention have been described in terms of the lens state and the lens state description, the invention is equally applicable to the lithographic apparatus state and the lithographic apparatus state description. Thus, embodiments of the invention may for example estimate a state of the lithographic apparatus.

Applying the calculated correction to the lithographic apparatus may comprises manipulating lenses of the projection system. Applying the calculated correction may further comprise adjusting the position or orientation of the mask or the wafer. Applying the calculated correction may further comprise adjusting the wavelength of the radiation used by the lithographic apparatus.

It will be appreciated that aspects of the present invention can be implemented in any convenient way including by way of suitable hardware and/or software. For example, a device arranged to implement the invention may be created using appropriate hardware components. Alternatively, a programmable device may be programmed to implement embodiments of the invention. The invention therefore also provides suitable computer programs for implementing aspects of the invention. Such computer programs can be carried on suitable carrier media including tangible carrier media (e.g. hard disks, CD ROMs and so on) and intangible carrier media such as communications signals.

In an embodiment, there is provided a method of reducing an aberration of a lithographic apparatus, the method comprising: measuring the aberration; taking the measured aberration into account, estimating a state of the lithographic apparatus; calculating a correction using the estimated state; and applying the correction to the lithographic apparatus.

In an embodiment, the estimated state of the lithographic apparatus is used to generate an estimated aberration of the lithographic apparatus. In an embodiment, estimating the state of the lithographic apparatus takes into account a history of operation of the lithographic apparatus. In an embodiment, a model generated using the history of operation of the lithographic apparatus is used when estimating the state of the lithographic apparatus. In an embodiment, estimating the state of the lithographic apparatus includes using a filter which applies a weighting to the measured aberration. In an embodiment, the filter is determined using the model along with an estimated joint covariance matrix. In an embodiment, the filter is a Kalman filter. In an embodiment, estimating the state of the lithographic apparatus uses a plurality of measured aberrations, and wherein different weightings are applied for different aberrations. In an embodiment, for some aberrations the weighting is such that only the measured aberration value is used. In an embodiment, for some aberrations the weighting is such that the measured aberration value is not used. In an embodiment, the state of the lithographic apparatus is estimated, and a correction is applied to the lithographic apparatus, before exposure of each target portion of a substrate. In an embodiment, estimating the state of the lithographic apparatus before each exposure does not include measuring the aberration before each exposure. In an embodiment, inputs used to generate the model include inputs relating to the environment of the projection system and inputs relating to exposure settings used by the lithographic apparatus. In an embodiment, an exposure setting comprises information relating to a mask being used by the lithographic apparatus and/or information relating to an illumination mode used by the lithographic apparatus. In an embodiment, the model is periodically recalibrated. In an embodiment, during recalibration of the model unprocessed measured aberrations are used to calculate the correction to be applied to the projection system if a new exposure setting is being used by the lithographic apparatus. In an embodiment, the model is recalibrated each time a lot of substrates has been exposed by the lithographic apparatus. In an embodiment, the recalibration comprises recalculating the model. In an embodiment, the recalibration comprises adding to the existing model a new model generated using newly received data. In an embodiment, the filter is periodically recalibrated. In an embodiment, the estimated aberration values are determined periodically using the model. In an embodiment, the estimated aberration values are determined before exposure of each target portion of a substrate by the lithographic apparatus. In an embodiment, the aberration or aberrations are measured periodically. In an embodiment, prior to measuring aberrations, the model is used to estimate aberrations caused by the projection system, a correction is calculated and the correction is applied to the lithographic apparatus. In an embodiment, the aberrations are measured prior to exposure of each substrate by the lithographic apparatus. In an embodiment, the aberration or aberrations are expressed as the variation of Zernike coefficients across the field. In an embodiment, the aberrations are expressed as Zernike coefficients of field orders. In an embodiment, applying the calculated correction to the lithographic apparatus comprises manipulating lenses of the projection system. In an embodiment, the model is generated using measurements obtained when the numerical aperture of the lithographic apparatus is at maximum, and the model is then modified to estimate aberrations caused by the projection system when the numerical aperture of the lithographic apparatus is reduced to a numerical aperture used during exposure of substrates. In an embodiment, the model is imported into the lithographic apparatus following generation of the model using a different lithographic apparatus. In an embodiment, the method further comprises monitoring for faults in the lithographic apparatus by monitoring differences between estimated expected aberrations and measured aberrations. In an embodiment, a fault is identified if the difference between an estimated expected aberration and a measured aberration is greater than an expected difference.

In an embodiment, there is provided a computer program comprising computer readable instructions configured to cause a processor to carry out a method as described herein. In an embodiment, there is provided a computer readable medium carrying a computer program as described herein. In an embodiment, there is provided a computer apparatus for reducing aberrations caused by a projection system of a lithographic apparatus comprising: a memory storing processor readable instructions; and a processor arranged to read and execute instructions stored in said memory; wherein said processor readable instructions comprise instructions arranged to control the computer to carry out a method as described herein.

In an embodiment, there is provided a lithographic apparatus comprising a projection system configured to projection a pattern from a mask onto a substrate, the lithographic apparatus further comprising: a sensor configured to measure aberrations caused by the projection system; a processor configured to calculate a correction to be applied to the projection system; and lens manipulators configured to apply the correction by manipulating lenses of the projection system; wherein the processor is configured to: estimate aberrations caused by the projection system, using the measured aberrations and a model which takes into account a history of operation of the lithographic apparatus; calculating the correction to be applied to the projection system using the estimated aberrations.

The invention claimed is:

1. A method of reducing an aberration of a lithographic apparatus, the method comprising:
   obtaining different types of measured aberration values;
   based on the measured aberration values and using a filter which applies a different weighting to the different types of measured aberration values based on the accuracy of the measured aberration values, estimating a state of the lithographic apparatus;
   calculating a correction using the estimated state; and
   applying the correction to the lithographic apparatus.

2. The method of claim 1, wherein the estimated state of the lithographic apparatus is used to generate an estimated aberration of the lithographic apparatus.

3. The method of claim 1, wherein estimating the state of the lithographic apparatus takes into account a history of operation of the lithographic apparatus.

4. The method of claim 3, wherein a model generated using the history of operation of the lithographic apparatus is used when estimating the state of the lithographic apparatus.

5. The method of claim 1, wherein the filter is determined using a model along with an estimated joint covariance matrix.

6. The method of claim 1, wherein the filter is a Kalman filter.

7. The method of claim 1, wherein the state of the lithographic apparatus is estimated, and a correction is applied to the lithographic apparatus, before exposure of each target portion of a substrate.

8. The method of claim 4, wherein the model is periodically recalibrated.

9. The method of claim 8, wherein during recalibration of the model unprocessed measured aberrations are used to calculate the correction to be applied to a projection system of the lithographic apparatus if a new exposure setting is being used by the lithographic apparatus.

10. The method of claim 8, wherein the recalibration comprises adding to the existing model a new model generated using newly received data.

11. The method of claim 4, wherein estimated aberration values are determined periodically using the model.

12. The method of claim 4, wherein prior to measuring the aberration, the model is used to estimate an aberration caused by the projection system, a correction is calculated and the correction is applied to the lithographic apparatus.

13. The method of claim 4, wherein the model is generated using measurements obtained when the numerical aperture of the lithographic apparatus is at maximum, and the model is then modified to estimate an aberration caused by the projection system when the numerical aperture of the lithographic apparatus is reduced to a numerical aperture used during exposure of substrates.

14. The method of claim 4, wherein the model is imported into the lithographic apparatus following generation of the model using a different lithographic apparatus.

15. The method of claim 1, further comprising monitoring for faults in the lithographic apparatus by monitoring a difference between an estimated expected aberration and a measured aberration.

16. The method of claim 15, wherein a fault is identified if the difference between an estimated expected aberration and a measured aberration is greater than an expected difference.

17. A non-transitory computer-readable medium carrying a computer program comprising computer readable instructions that, upon execution by a processor system, are configured to cause the processor system to at least:
   obtain different types of measured aberration values of a lithographic apparatus;
   based on the measured aberration values, estimate a state of the lithographic apparatus, wherein estimation of the state of the lithographic apparatus includes using a filter which applies a different weighting to the different types of measured aberration values based on the accuracy of the measured aberration values;
   calculate a correction using the estimated state; and
   generate a signal for applying the correction to the lithographic apparatus.

18. A lithographic apparatus comprising a projection system configured to projection a pattern from a mask onto a substrate, the lithographic apparatus further comprising:
   a sensor configured to measure an aberration caused by the projection system;
   a processor configured to calculate a correction to be applied to the projection system; and
   lens manipulators configured to apply the correction by manipulating one or more lenses of the projection system,
   wherein the processor is configured to:
      obtain measured values of different types of the aberration by the sensor;
      based on the measured aberration values and use of a filter which applies a different weighting to the different types of measured aberration values based on the accuracy of the measured aberration values, estimate a state of the lithographic apparatus;
      calculate a correction using the estimated state; and
      cause application of the correction to the lithographic apparatus.

19. The computer-readable medium of claim 17, wherein the filter is a Kalman filter or wherein the instructions are further configured to determine the filter using a model along with an estimated joint covariance matrix.

20. The computer-readable medium of claim 17, wherein the instructions are further configured to monitor for faults in the lithographic apparatus by monitoring a difference between an estimated expected aberration and a measured aberration.

* * * * *